(12) United States Patent
Sato

(10) Patent No.: US 6,218,199 B1
(45) Date of Patent: Apr. 17, 2001

(54) SILICON SUBSTRATE WITH IDENTIFICATION DATA

(76) Inventor: Kazuo Sato, 1001-128, Aza Mura-higashi, Oaza Iidera, Mondenmachi, Aizuwakamatsu, Fukushima 965-0846 (JP)

( * ) Notice: Subject to any disclaimer, the term of this patent is extended or adjusted under 35 U.S.C. 154(b) by 0 days.

(21) Appl. No.: 09/253,522

(22) Filed: Feb. 19, 1999

(30) Foreign Application Priority Data

Feb. 20, 1998 (JP) .................................................. 10-055980

(51) Int. Cl.[7] .......................... H01L 21/66; G01R 31/26
(52) U.S. Cl. ................................ 438/14; 438/16; 438/17; 438/18; 368/10; 368/327; 714/25; 714/46
(58) Field of Search ................................... 438/14, 16, 17, 438/18

(56) References Cited

U.S. PATENT DOCUMENTS

| | | | |
|---|---|---|---|
| 5,862,101 | * | 1/1999 | Haas et al. ............................. 368/327 |
| 5,962,862 | * | 9/1999 | Evers et al. ........................ 250/559.4 |
| 6,049,895 | * | 4/2000 | Sugimoto ................................ 714/45 |

* cited by examiner

*Primary Examiner*—David Nelms
*Assistant Examiner*—Renee R. Berry
(74) *Attorney, Agent, or Firm*—Snider & Associates; Ronald R. Snider

(57) ABSTRACT

A bright-pattern unit cell is formed by forming round dots, each of which is composed of a hemispherical concave portion obtained by applying a laser beam, and arranging these round dots in a matrix vertically and horizontally. Furthermore, a two-dimensional code composed of a matrix having a bright and dark pattern is formed by defining a smooth surface, where a laser beam is not applied, as a dark-pattern unit cell, and combining these bright unit cells with dark unit cells.

2 Claims, 5 Drawing Sheets

SILICON SUBSTRATE WITH IDENTIFICATION DATA

BACKGROUND OF THE INVENTION

1. Field of the Invention

The present invention relates to a silicon wafer having identification data composed of a two-dimensional code on a silicon wafer, which becomes a semiconductor substrate, and a silicon substrate of a semiconductor chip, and a production method thereof.

2. Description of the Prior Art

Recently, in semiconductor production processes, it has been required to individually manage each of silicon wafers or semiconductor chips whose circuits are formed on these silicon wafers in each process. Since a silicon wafer is hard and clear, it is not possible to print identification data such as a kind of material and a production number on this wafer. Hence, conventionally, the wafer is directly burnt by a laser for expressing an article number and the like in alphabetic characters and figures.

In addition, since a semiconductor chip obtained by dicing semiconductor circuits, which are formed on the silicon wafer, in several cm square is small, it is not possible to individually manage each semiconductor chip because of no space for describing the identification data. In this manner, it is not possible to record plenty of information such as a manufacturer's name, a production date, a kind of material, and a production number. It is because the data volume described is small if the data is expressed in the alphabetic characters and FIGS. on a silicon substrate such as a silicon wafer and a semiconductor chip.

BRIEF SUMMARY OF THE INVENTION

OBJECT OF THE INVENTION

The present invention is performed to solve this problem. The present invention provides a silicon substrate with identification data, which can individually manage a silicon wafer and a small semiconductor chip by forming a two-dimensional code, which can record plenty of data, on a hard and clear silicon surface, and a production method thereof.

SUMMARY OF THE INVENTION

A silicon substrate with identification data that is a first form of the present invention is characterized in forming a two-dimensional code composed of a matrix having a bright and dark pattern by defining a smooth surface as a dark-pattern unit cell, defining a scattering surface as a bright-pattern unit cell, and combining these dark-pattern unit cells with bright-pattern unit cells.

In addition, a silicon substrate with identification data that is a second form of the present invention is characterized in that a bright-pattern cell in a two-dimensional code formed by a matrix having a bright and dark pattern is formed by unit cells composed of dots, which are arranged in n rows and n columns, or n rows and m columns (here, n and m are integers) and each is round in a top view, and that each of the round dots is formed by a hemispherical concave portion.

Furthermore, a production method of a silicon substrate with identification data that is a third form of the present invention is characterized in: forming dots, each of which is round in a top view and is composed of a hemispherical concave portion formed by applying a laser beam on a surface of a silicon substrate; forming a bright-pattern unit cell by arranging these dots in n rows and n columns, or n rows and m columns (here, n and m are integers) vertically and horizontally; defining a smooth surface, where a laser beam is not applied, as a dark-pattern unit cell; and forming a two-dimensional code composed of a matrix having a bright and dark pattern, which is formed by combining these bright unit cells and these dark unit cells.

DETAILED DESCRIPTION OF THE PREFERRED EMBODIMENTS

Figure 1:
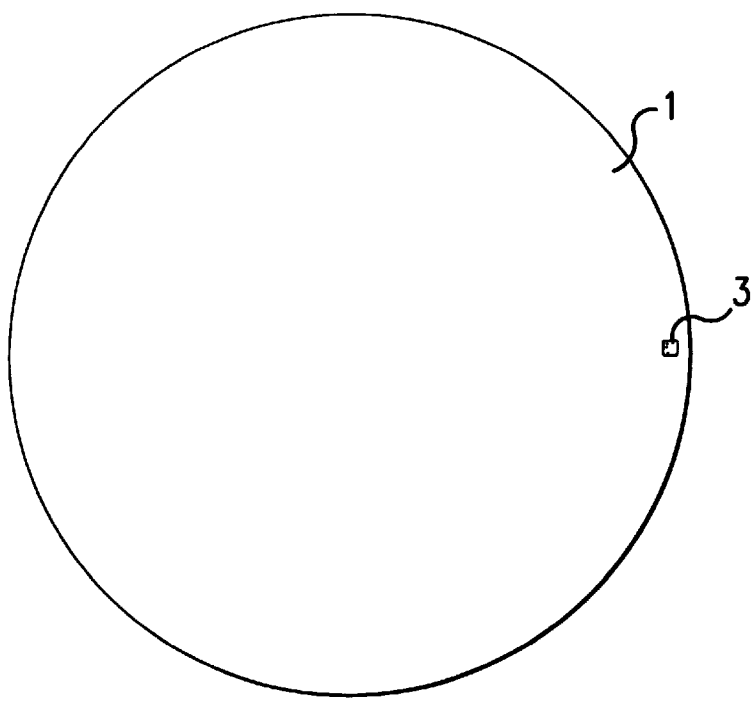
FIG. 1 is a top view of a silicon wafer, where a two-dimensional code is formed, according to a first embodiment of the present invention.
Figure 2:
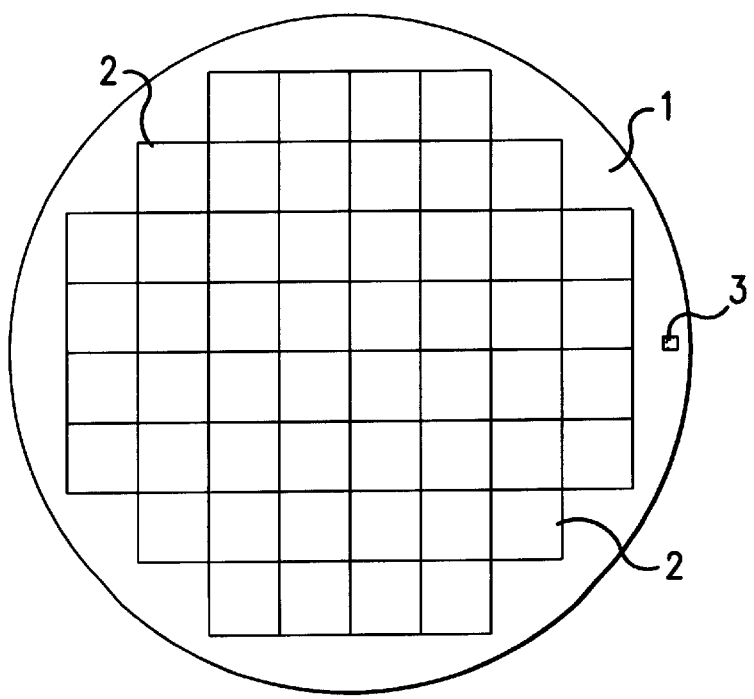
FIG. 2 is a top view showing a state of forming semiconductor chips on the silicon wafer shown in FIG. 1.

An embodiment of the present invention will be described in detail with reference to FIGS. 1 through 5. In the drawings, a silicon wafer 1 is produced by slicing a silicon monocrystal rod in thin pieces, and, after forming circuits on this wafer as shown in FIG. 2, plenty of semiconductor chips 2 are formed by dicing this wafer. In the circumference of a surface of this silicon wafer, a two-dimensional code 3 is formed.

Figure 3:
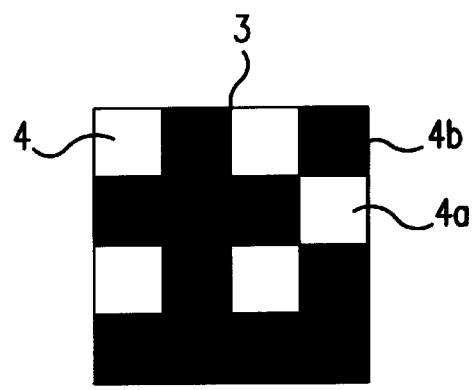
FIG. 3 is a top view showing the two-dimensional code shown in FIG. 1 with enlarging the code.

For example, if 16 pieces of square cells 4 . . . , as shown in FIG. 3 with being enlarged, are formed by separating an area of 1.2 mm square in squares of 4 rows and 4 columns, each cell 4 is formed in the shape of a square each side of which is 240 (m long. These cells are made to be bright unit cells 4a and dark unit cells 4b, and these unit cells are combined vertically and horizontally according to information data to form the two-dimensional code 3 composed of a matrix having a bright and dark pattern.

A method for generating this two-dimensional code 3 comprises steps of generating image data in a matrix having a bright and dark pattern on a screen of a personal computer with using a graphic software package, and properly applying a laser beam to a portion, where a bright unit cell 4a is formed, on a surface of the silicon wafer 1 on the basis of a two-dimensional code generated from this image data for processing.

Figure 4:
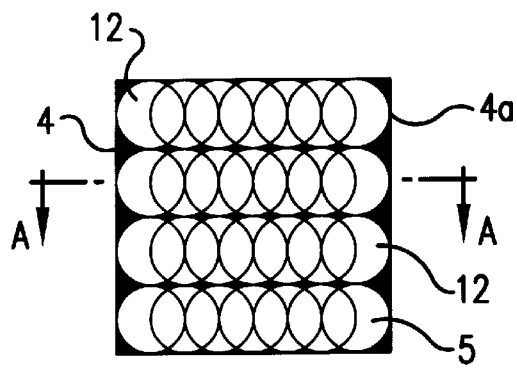
FIG. 4 is a top view showing a state of forming a bright cell by round dots, each of which is obtained by applying a laser beam, overlapping each other.
Figure 5:
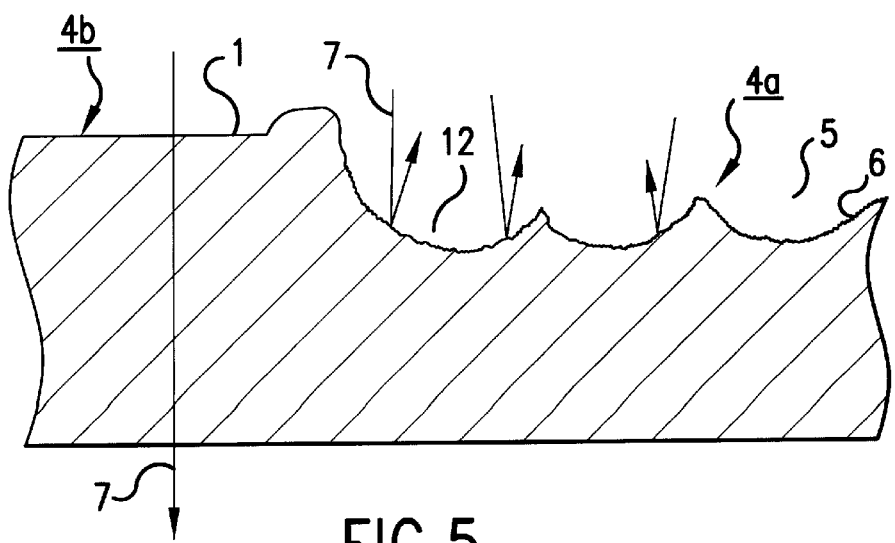
FIG. 5 is an enlarged cross-sectional view taken on line A—A of FIG. 4.

In case of applying a laser beam, as shown in FIG. 4, the bright unit cell 4a is formed by sequentially combining line-drawing continuous data composed of bit map data. In this manner, by making round dots 12 overlap each other with intermittently applying a laser beam, a groove-shaped concave portion 5, as shown in FIG. 5, is formed. Since the surface of this concave portion 5 becomes a rough surface 6, a bright unit cell 4a is formed. In addition, a dark unit cell 4b is left as it is without any processing. By combining these unit cells, a two-dimensional code 3 composed of a matrix having a bright and dark pattern, which is shown in FIG. 3, can be formed.

When this two-dimensional code is read by a light reflection type reader, a silicon wafer 1, as shown in FIG. 5, is clear, and hence a portion that is not processed makes light 7 pass without reflection. Hence, the portion is recognized as a dark unit cell 4b by the reader. In addition, since the rough surface 6 is formed on the surface of the concave portion 5, the light 7 is irregularly reflected. Therefore, this portion is recognized as a bright unit cell 4a by the reader. Hence, by combining these unit cells, it is possible to read these unit cells similarly to a two-dimensional code 3 that is expressed by printing a bright and dark pattern.

This two-dimensional code 3 has extremely large data volume per unit area in comparison with a bar code since this code 3 can record 12 alphanumeric characters per mm2. Therefore, this code 3 has such advantages that this code 3 can not only record large volume of information but also be read from any directions, that is, any angles. Furthermore, this code 3 has such other advantages that this code 3 not only has a function of being able to recover data even if a part of the code is damaged or contaminated, but also can secretly manage information by enciphering data.

Figure 6:
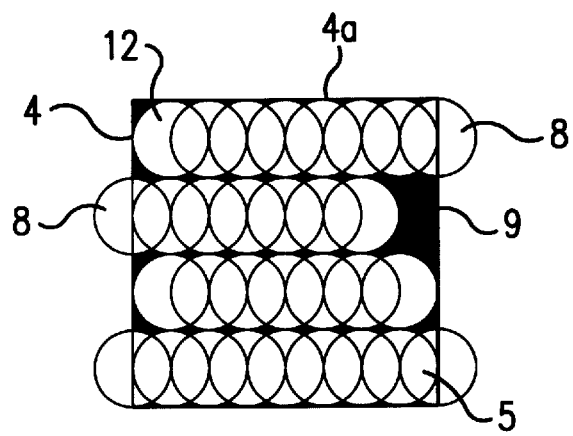
FIG. 6 is a top view showing a bright cell where projecting portions and blank portions are formed by round dots, each of which is obtained by applying a laser beam, overlapping each other.

When a bright unit cell 4a is formed on the surface of the silicon wafer 1 in this manner, a laser beam is scanned in the left and right directions and burns the surface of the silicon wafer 1 linearly toward the lower reach. In this method, since irradiation intervals of the laser are not regulated, the laser beam is applied also out of an area of a cell. For example, as shown in FIG. 6, the laser beam shifts in the left and right directions, and in consequence, a projecting portion 8 or a blank portion may occur. If the two-dimensional code 3 including such an irregular cell 4 is formed, the code 3 may be read as erroneous data by the reader. In particular, this method has such a problem that read errors increase in case of a fine two-dimensional code 3 having a cell each side of which is nearly 1 mm long.

This is because it is not defined that vector data necessary for forming a cell exists only within a cell area. Thus, instead of recognizing 16 cells 4 . . , which are formed within a matrix of 4 rows and 4 columns, as separate unit cells, the two-dimensional code 3 is formed by sequentially combining line-drawing continuous data composed of bit map data on the basis of image data. Therefore, a coordinate control method where a starting point and an end point are recognized is not adopted, and hence an irregular cell is formed as a consequence. In addition, as shown in FIG. 5, if continuous concave portions 5 are formed by applying a laser beam with a next laser beam overlapping a previous laser beam, plenty of fine dusts scatter and may harmfully affect the formation of a semiconductor circuit.

Figure 7:
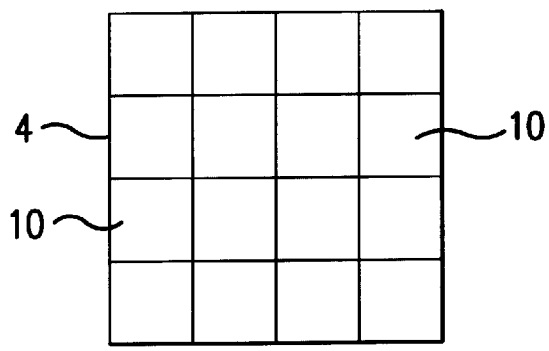
FIG. 7 is a top view showing a state of dividing a cell into a plurality of irradiated areas.
Figure 8:
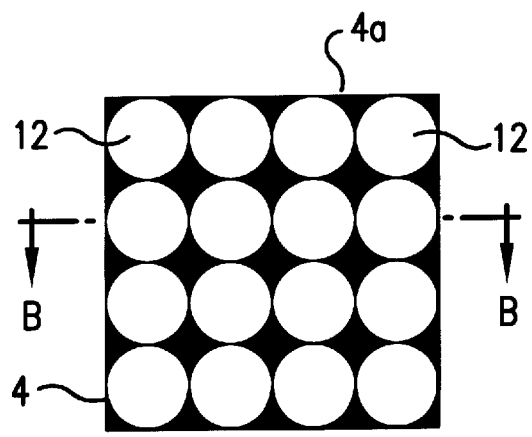
FIG. 8 is a top view showing a bright unit cell formed by round dots each of which is formed in an irradiated area shown in FIG. 7.

FIGS. 7 through 10 show another embodiment of the present invention. The procedure according to this embodiment comprises steps of: generating image data, composed of a matrix having a bright and dark pattern, on a screen of a personal computer; dividing a portion, where a bright unit cell 4a is formed, as shown in FIG. 7, for example, as a cell 4 of 240 (m square, into 16 irradiated areas 10 . . . , composed of a matrix of 4 rows and 4 columns, on the basis of a two-dimensional code generated from this image data; roundly burning respective irradiated areas 10 by sequentially applying the laser beam to the surface of the silicon wafer 1 with positionally controlling the laser beam in the X and Y directions within respective irradiated areas 10 . . . divided; and forming 16 round dots 12 as shown in FIG. 8. Thus, a bright unit cell in the image data is formed by substituting a unit cell, where 16 round dots 12 are arranged in a matrix, for the bright unit cell in the image data.

Figure 10:
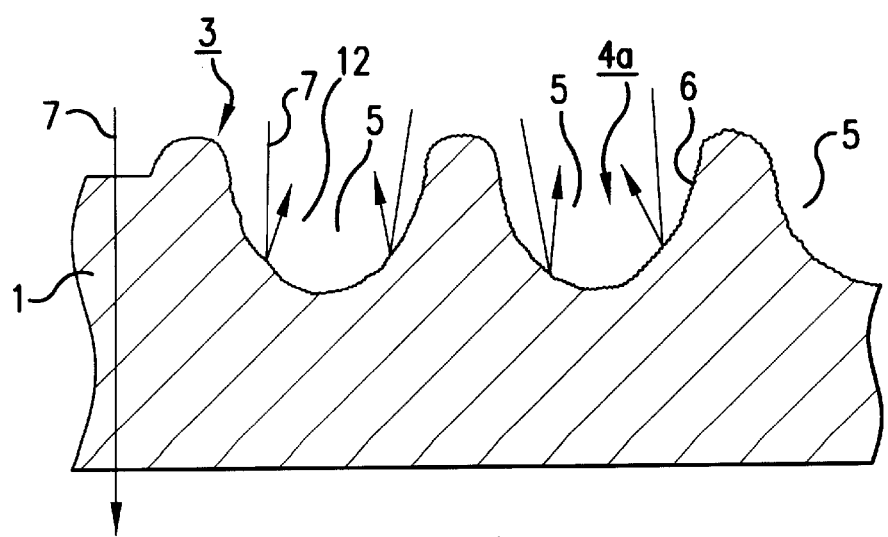
FIG. 10 is an enlarged cross-sectional view taken on line B—B of FIG. 8.

In this case, since each round dot 12 contacts to adjacent round dots 12, it is not necessary that each round dot 12 overlaps the adjacent round dots. In addition, the round dot 12 formed by applying the laser beam has a round shape in a top view, and its cross-section, as shown in FIG. 10, is formed with hemispherical concave portions 5 being arranged at certain intervals. Furthermore, the bright unit cell 4a, as shown in FIG. 8, is formed by arranging these dots in a matrix of 4 rows and 4 columns.

Moreover, these round dots 12 can be formed with intermittently applying intermittently a laser beam through positionally controlling the laser beam in the X and Y directions to an irradiated area 10. Therefore, this method can largely reduce forming-time and generated-dust in comparison with a method of linearly burning a silicon wafer through moving a laser beam from an upper side to a lower side with scanning the laser beam in the left and right directions. Furthermore, if the diameter of the round dot 12 is made to be the same as the beam diameter of the laser beam, the round dots 12 can be formed at the irradiation intervals of the laser beam. Therefore, since it is possible to apply the laser beam lest a next laser beam should overlap a previous laser beam, a profile of a cell becomes distinct. Moreover, adjustment of burning-depth is easy and the two-dimensional code 3 can be produced in a short time.

Figure 9:
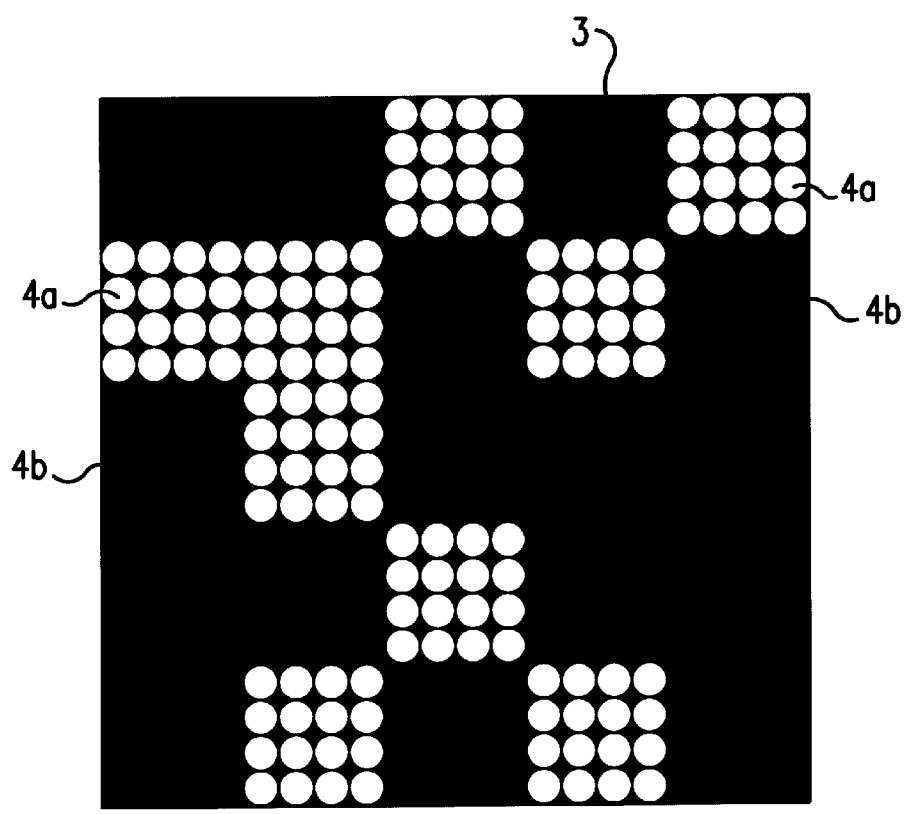
FIG. 9 is a top view showing a two-dimensional code composed by combining bright unit cells, one of which is shown in FIG. 8, with dark unit cells.

In this manner, by arranging bright unit cells 4a, to each of which a laser beam is applied, and dark unit cells 4b, to each of which the laser beam is not applied, in a matrix as shown in FIG. 9, the two-dimensional code 3 having a bright and dark pattern is formed. When a light reflection type reader reads the two-dimensional code 3 formed on the surface of the silicon wafer 1, it is judged by recognizing a corner portion of a dark unit cell 4b that the unit cell is a dark cell. Owing to this, even if a bright unit cell 4a having round white dots 12 at corners thereof has several dark portions therein, the unit cell 4a can be recognized as a bright-pattern cell similarly to a conventional white unit cell printed.

In this manner, by substituting a set of round dots 12 of n rows and n columns (here, n is an integer) for a cell 4 which is blackly painted over in the image data on the screen of the personal computer, the cell 4 is recognized as a bright unit cell 4a. Furthermore, this cell is burnt with coordinate control. Therefore, since a projecting portion 8 or a blank portion 9 is not formed, read accuracy can be increased.

Therefore, it is possible to easily form the two-dimensional code 3, which has plenty of data volume, on the surface of the silicon wafer 1, it is possible to record plenty of identification data such as a manufacturer's name, a production date, a kind of material, and a production number. Furthermore, it is possible to control processes as well as products. In addition, if two-dimensional codes 3 are burnt on plenty of semiconductor chips 2 that are formed on the silicon wafer 1, it is possible to form the two-dimensional codes 3 on corresponding-portions of the back face of the silicon wafer 1 where the semiconductor chips 2 are formed. Hence, it becomes possible to perform production control and process control of respective semiconductor chips 2 divided.

Figure 11:
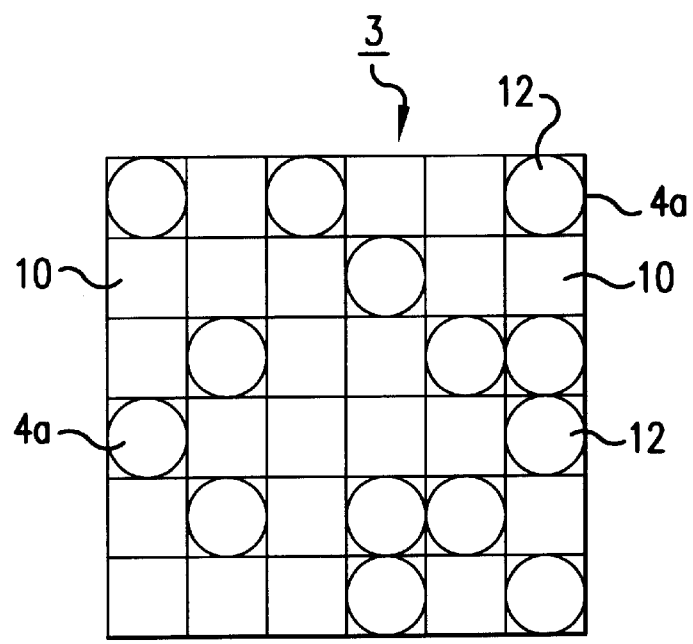
FIG. 11 is a top view showing a two-dimensional code in case of forming one bright unit cell with one round dot, the two-dimensional code relating to another embodiment of the present invention.

FIG. 11 shows still another embodiment of the present invention. In this embodiment, a two-dimensional code 3 is divided into 36 irradiated areas 10. . . of 6 rows and 6 columns. In a two-dimensional code composed by arranging unit cells having bright and dark patterns in a matrix, by sequentially applying a laser beam with positionally controlling the laser beam in the X and Y directions within each of irradiated areas 10 . . . corresponding to bright unit cells 4a, a round dot 12 is burnt. In this case, the diameter of the round dot 12 is made to be the same as the length of a side of the unit cell. Thus, in this case, since a bright unit cell 4a is composed of one round dot 12, a matrix of n (n becomes a matrix of 1 (1.

When the above method is applied to the silicon wafer 1, a two-dimensional code 3 a side of which is 480 (m long is divided into 16 rows and 16 columns, and 256 irradiated areas 10 . . . each of which has each side of 30 (m long. Only one round dot 12 whose diameter is 30 (m, as shown in FIG. 11, is burnt by applying a laser beam with positionally controlling the laser beam in the X and Y directions within each of irradiated areas 10 . . . corresponding to bright-pattern cells in image data of the two-dimensional code. In this manner, 12 alphanumeric characters could be recorded in the two-dimensional code 3 that was burnt into the surface of the silicon wafer 1.

Figure 12:
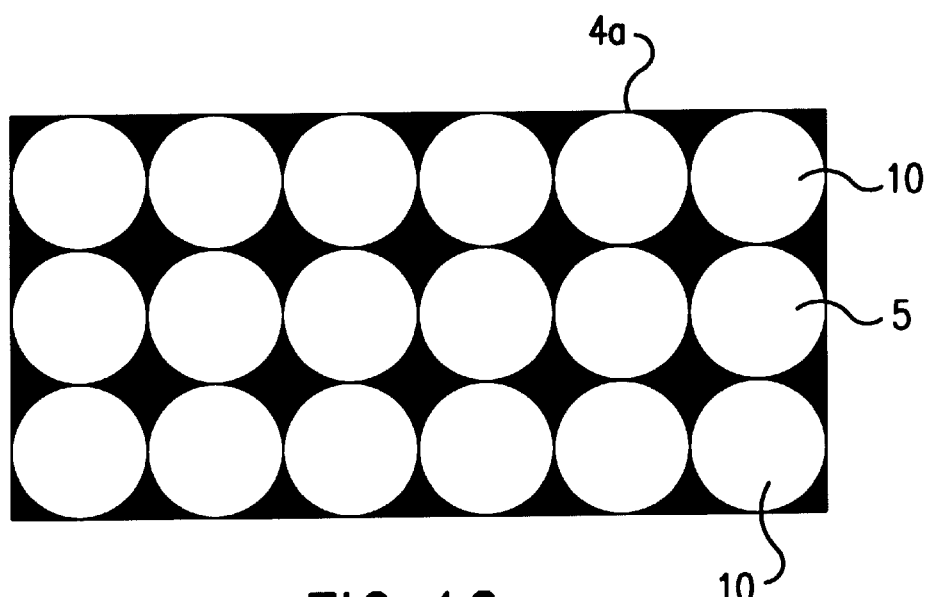
FIG. 12 is a top view showing a two-dimensional code composed of round dots arranged in a rectangular matrix of 3 rows and 6 columns, the two-dimensional code relating to still another embodiment of the present invention.

In addition, although a case of forming a bright unit cell 4a by arranging a round dot 12 in a matrix of one row and one column and round dots 12 in a matrix of 4 rows and 4 columns is described above, arrangement in a square matrix of order n such as a matrix of 2 rows and 2 columns, a matrix of 3 rows and 3 columns, or a matrix of 6 rows and 6 columns can be applied. In addition, as for the shape of a cell, arrangement in a rectangular matrix of n rows and m columns (here, m is an integer) such as a matrix of 2 rows and 4 columns or a matrix of 3 rows and 6 columns, which is shown in FIG. 12, can be applied. Furthermore, the present invention is not limited to a silicon substrate, but can be used as identification data for clear objects such as a clear glass and a jewel.

As described above, a silicon substrate with identification data according to the first form of the present invention has a two-dimensional code formed by defining a smooth surface as a dark-pattern unit cell, defining a scattering surface as a bright-pattern unit cell, and combining these dark and bright unit cells. Therefore, it is possible to record a plenty of data on a surface of a hard clear silicon wafer and to control a silicon wafer and a semiconductor chip individually.

In addition, a silicon substrate according to the second form of the present invention has a two-dimensional code formed by forming one bright-pattern cell with unit cells in each of which round dots are arranged in a matrix vertically and horizontally, and forming the round dots with spherical concave portions. Therefore, the profile of the cell becomes distinct, and hence read accuracy can be increased.

Furthermore, a production method of a silicon substrate with identification data according to the third form of the present invention has a step of intermittently applying a laser beam to irradiated areas with positionally controlling the laser beam in the X and Y directions. Therefore, this method can largely reduce forming-time and generated-dust in comparison with a method of linearly burning a silicon wafer continuously. Furthermore, if the diameter of the round dot is made to be the same as the beam diameter of the laser beam, the round dots can be formed at the irradiation intervals of the laser beam. Hence, two-dimensional code can be produced in a short time.

Note that the aforementioned disclosure claims the priority of and relates to the subject matter contained in Japanese Patent Application No. 10-55980 filed on Feb. 20, 1998, which is incorporated by reference in this application in its entirety.

What is claimed is:

1. A silicon substrate with identification data comprising a two-dimensional code composed of a matrix having a bright and dark pattern by defining a smooth surface as a dark-pattern unit cell, defining a scattering surface as a bright-pattern unit cell, and combining these dark-pattern unit cells with bright-pattern unit cells.

2. A silicon substrate with identification data according to claim 1, wherein a bright-pattern cell in a two-dimensional code composed of a matrix having a bright and dark pattern is formed by unit cells composed of dots, which are arranged in n rows and n columns, or n rows and m columns (here, n and m are integers) and each are round in a top view, and wherein each of the dots, which is round in a top view, is composed of a hemispherical concave portion.

* * * * *